United States Patent
Yu et al.

(10) Patent No.: US 7,450,677 B2
(45) Date of Patent: Nov. 11, 2008

(54) CLOCK AND DATA RECOVERY APPARATUS AND METHOD THEREOF

(75) Inventors: Chueh-hao Yu, Hsinchu (TW); Li-Ren Huang, Hsinchu (TW)

(73) Assignee: Industrial Technology Research Institute, Hsinch (TW)

( * ) Notice: Subject to any disclaimer, the term of this patent is extended or adjusted under 35 U.S.C. 154(b) by 523 days.

(21) Appl. No.: 11/126,452

(22) Filed: May 11, 2005

(65) Prior Publication Data

US 2006/0115035 A1    Jun. 1, 2006

(30) Foreign Application Priority Data

Dec. 1, 2004    (TW) .............................. 93137081 A

(51) Int. Cl.
*H04L 7/00*    (2006.01)
(52) U.S. Cl. ........................................ 375/371; 375/355
(58) Field of Classification Search ................ 375/355, 375/362, 371, 373–376; 370/503, 516
See application file for complete search history.

(56) References Cited

U.S. PATENT DOCUMENTS

| | | | |
|---|---|---|---|
| 4,015,083 A * | 3/1977 | Bellisio ...................... 375/376 |
| 5,237,290 A | 8/1993 | Banu et al. | |
| 5,418,496 A | 5/1995 | Ford et al. | |
| 5,757,872 A | 5/1998 | Banu et al. | |
| 5,809,095 A * | 9/1998 | Nakao ......................... 375/374 |
| 6,122,336 A * | 9/2000 | Anderson ................... 375/371 |
| 6,259,326 B1 | 7/2001 | Dunlop et al. | |
| 6,909,331 B2 * | 6/2005 | Ballantyne ................... 331/10 |
| 6,937,685 B2 * | 8/2005 | Tang ........................... 375/376 |
| 7,263,153 B2 * | 8/2007 | Sutioso et al. .............. 375/373 |
| 2004/0046596 A1 | 3/2004 | Kaeriyama et al. | |
| 2004/0258188 A1 * | 12/2004 | Kim et al. .................... 375/376 |

* cited by examiner

*Primary Examiner*—Khanh C Tran
(74) *Attorney, Agent, or Firm*—Apex Juris, pllc; Tracy M. Heims

(57) ABSTRACT

A clock and data recovery apparatus and the method thereof are applied for burst mode clock and data recovery (CDR) in a passive optical network (PON). A phase-locked loop induces a first control signal and a first clock. A clock and data recovery circuit receives an incoming data having a first frequency and induces a second clock having one of second and third frequencies to sample the incoming data according to the second clock to obtain a recovered data, wherein the first frequency is between the second and third frequencies. Moreover, a controller induces a second control signal according to the incoming data (or the recovered data), the first clock, and the second clock to adjust the frequency of the second clock.

19 Claims, 9 Drawing Sheets

CLOCK AND DATA RECOVERY APPARATUS AND METHOD THEREOF

BACKGROUND

1. Field of Invention

The invention relates to a clock and data recovery apparatus and the method thereof, and more particularly to a clock and data recovery apparatus for burst mode clock and data recovery in a passive optical network.

2. Related Art

During the process of data transmission, a transmitter continuous sends digital signals to a receiver. That is, each bit is transmitted within a fixed time. Therefore, the receiver uses a clock and data recovery (CDR) apparatus to generate a clock corresponding to the incoming data, thereby correctly retiming the incoming data. How to make a clock frequency exactly corresponding to a frequency of the incoming data is a very important issue.

As shown in FIG. 1, a conventional clock and data recovery apparatus includes a clock and data recovery circuit 110 and a phase-locked loop (PLL) 120. The PLL 120 generates a system clock Sys CK according to a reference clock Ref CK, and imposes a voltage signal Sv to the clock and data recovery circuit 110. In this case, the clock and data recovery circuit 110 generates a recovered clock CKr with an output frequency corresponding to the voltage signal Sv. The received data DATA are sampled by the recovered clock CKr as data DATAr. This technique has been disclosed in, for example, the U.S. Pat. Nos. 5,237,290 and 6,259,326 B1.

Because of the lack of the feedback control system, the frequency of the conventional CDR may be affected by process variation. Therefore, the output frequency from of CDR is not exactly equal to the data frequency fd, as shown in FIG. 2 (fnom≠fd on the frequency axis). This frequency mismatch will result in a phase shift in each sampling. If the input data are consecutive identical bits, then the phase shifts will accumulate because of the lack of data transitions. In the end, the maximum allowable number of consecutive identical bits to be transmitted has to be restricted. Consequently, the bit error rate (BER) becomes worse when the input stream contains longer consecutive identical bits.

SUMMARY OF THE INVENTION

In view of the foregoing, an objective of the invention is to provide a clock and data recovery (CDR) apparatus and the method thereof to solve the many restrictions and drawbacks existing in the prior art.

The disclosed invention is to provide a CDR apparatus and the method thereof to solve the problem that the CDR circuit cannot accurately recover the clock signal of the data rate.

The disclosed invention is to provide a CDR apparatus and the method thereof to be applied in a passive optical network (PON).

The disclosed invention is to provide a CDR apparatus and the method thereof to selectively generate two recovered clocks with different frequencies.

The disclosed invention is to provide a CDR apparatus and the method thereof to adjust the frequency of the recovered clock using a controller.

The disclosed CDR apparatus and the method thereof achieve at least an improved effect, which includes solving the restriction in maximum run length of the incoming data, increasing the high-frequency jitter tolerance, and improving the output jitter contributed by frequency mismatch.

To achieve the above objectives, a CDR apparatus of the invention includes: a phase-locked circuit, a CDR circuit, and a controller, wherein all components connect with each other. The phase-locked circuit generates a first control signal and a first clock having a plurality of phases, and the CDR circuit receives an incoming data and generates a second clock according to the first control signal to sample the incoming data based on the second clock. The controller generates a second control signal according to the incoming data (or the recovered data), the first clock and the second clock to adjust the frequency of the second clock.

In this case, the incoming data (or the recovered data) have a first frequency, and the frequency of the second clock is one of a second frequency and a third frequency. The first frequency is between the second and third frequencies.

In one embodiment, the controller includes: two or more flip-flops, a detector, a latch circuit, and a digital signal processing circuit. Each of the flip-flops is connected via the latch circuit to the digital signal processing circuit. The detector, the latch circuit, and the digital signal processing circuit are connected in series.

The first clock has several phases. The first clock of each phase is outputted to each of the flip-flops, which samples the first clock based on the second clock to generate a first signal. The detector detects the bit edges of the incoming data (or the recovered data) and outputs an enable signal according to the detected result. The latch circuit outputs a second signal corresponding to the first signal from the flip-flops in response to the enable signal. Afterward the digital signal processing circuit generates a second control signal based on the second signal and the first signal from the flip-flops.

The digital signal processing circuit includes: a multiplexer, at least four state maintaining processors, and a sum circuit.

The multiplexer is connected to the sum circuit via each the state maintaining processors. The multiplexer outputs the first signal from each flip-flop into one of the state maintaining processors, which is corresponding to the second signal, according to the second signal. Each of the state maintaining processor generates a third control signal based on the state of receiving the first signal, and the sum circuit adds the third control signals from all the sate maintaining processors up to generate a second control signal.

In another embodiment, the configuration is that each of the state maintaining processors connects with the sum circuit via the multiplexer. In this case, each of the state maintaining processors receives the first signals from all the flip-flops and generates a third control signal based on the first signals. Then, the multiplexer outputs the third control signals based on the second signal from the latch circuit. Afterward, the sum circuit adds the third control signals from the multiplexer up to generate the second control signal.

Further, the invention discloses a clock and data recovery method including the steps of: receiving an incoming data with a first frequency; generating a second clock with a second frequency and sampling the incoming data based on the second clock; forming a sampling region based on a first clock with multiple phases; switching a frequency of the second clock from the second frequency to a third frequency when a sampling point of the incoming data is about to go beyond one edge of the sampling region; switching the frequency of the second clock from the third frequency back to the second frequency when the sampling point is about to go beyond another edge of the sampling region; and repeating the above two steps until sampling the incoming data is accomplished. The first frequency is between the second and the third frequencies.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
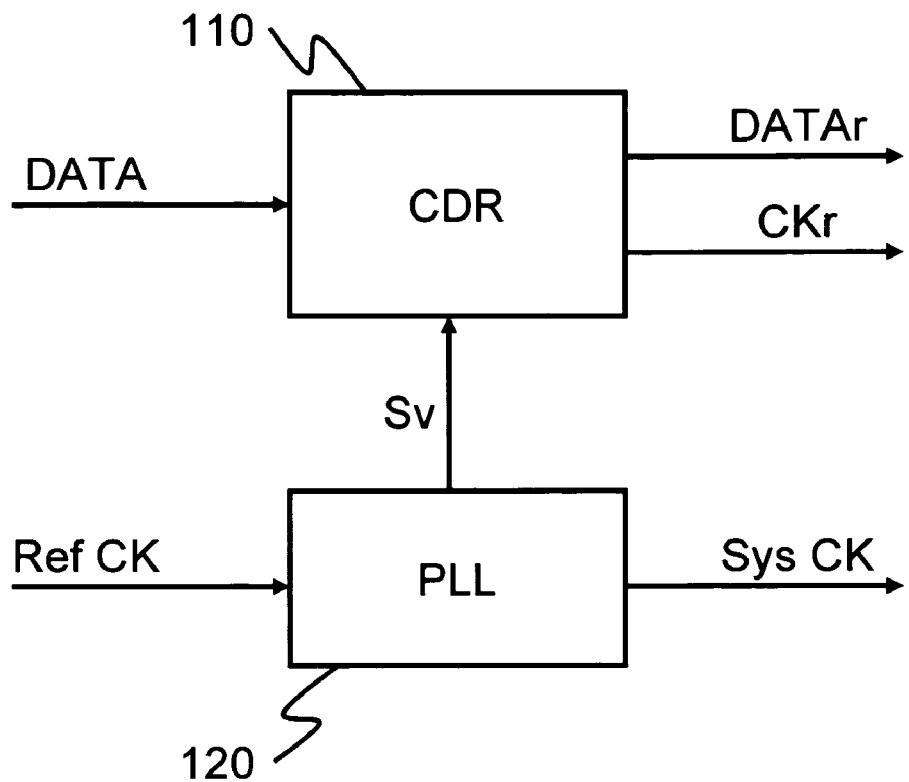
FIG. 1 shows the system structure of a conventional CDR apparatus.
Figure 2:
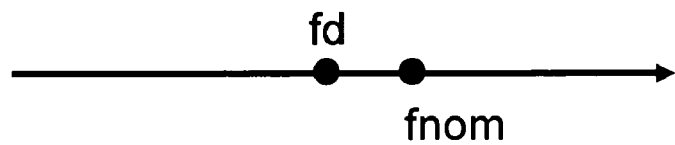
FIG. 2 is a schematic view of the frequency error generated by the CDR apparatus in FIG. 1.
Figure 3:
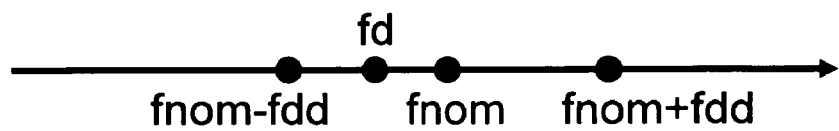
FIG. 3 is a schematic view of the frequency error generated a clock and data recovery (CDR) apparatus according to the present invention.

We first explain the main idea of the invention using FIG. 3. The invention uses a second and a third frequency (fnom±fbb) in the vicinity of the first frequency (fd) to correctly simulate the first frequency. The invention utilizes two major techniques. The oscillator in the CDR circuit can provide two frequencies (fnom±fbb). A controller is used to control the switch between the two frequencies (fnom±fbb) in order to obtain an output frequency almost equal to the first frequency fd. Moreover, the first frequency is a frequency of an incoming data or a recovered data generated previously.

Figure 4:
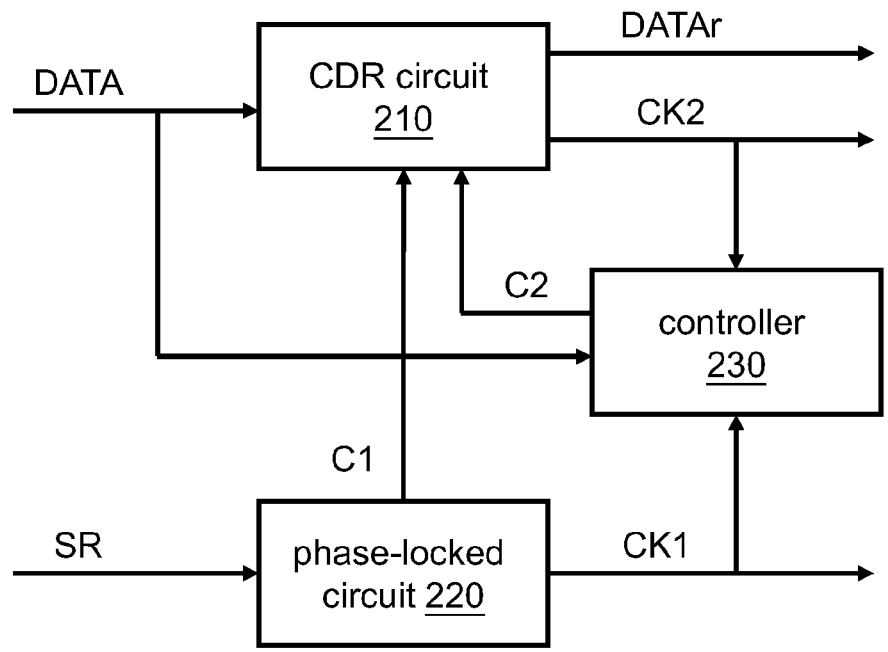
FIG. 4 shows the system structure of the CDR apparatus according to an embodiment of the invention.

With reference to FIG. 4, the system according to an embodiment of the disclosed CDR apparatus includes: a CDR circuit 210, a phase-locked circuit 220, and a controller 230.

The CDR circuit 210, the phase-locked circuit 220, and the controller 230 connect with each other. When the CDR circuit 210 receives an incoming data DATA, the phase-locked circuit 220 generates a first control signal C1 based on a reference signal SR for the CDR circuit 210 and a first clock CK1 for the controller 230. The CDR circuit 210 generates a second clock CK2 according to the first control signal C1 and samples the incoming data DATA based on the second clock CK2 to obtain a recovered data DATAr. The controller 230 generates a second control signal C2 according to the incoming data DATA, the first clock CK1 and the second clock CK2, and the CDR circuit 210 adjust the frequency of the second clock CK2 according to the second control signal C2.

In this embodiment, the incoming data DATA received by the CDR circuit 210 has a first frequency. The CDR circuit 210 generates one of two second clocks CK2 with a second frequency and a third frequency respectively. Moreover, the second control signal C2 from the controller 230 is used to switch the second clock CK2, which is outputted by the CDR circuit 210 between the second and third frequencies. In particular, the first frequency is between the second and third frequencies.

The relationship between the signal frequency (i.e. the first frequency) of the incoming data DATA and the signal frequency of the reference signal SR is a positive integer multiple. The signal frequency of the incoming data DATA is the positive integer multiple of the signal frequency of the reference signal SR. Moreover, the signal frequency of the incoming data DATA is substantially the same as the signal frequency of the first clock CK1. In this case, the first clock CK1 is a system clock.

Figure 5:
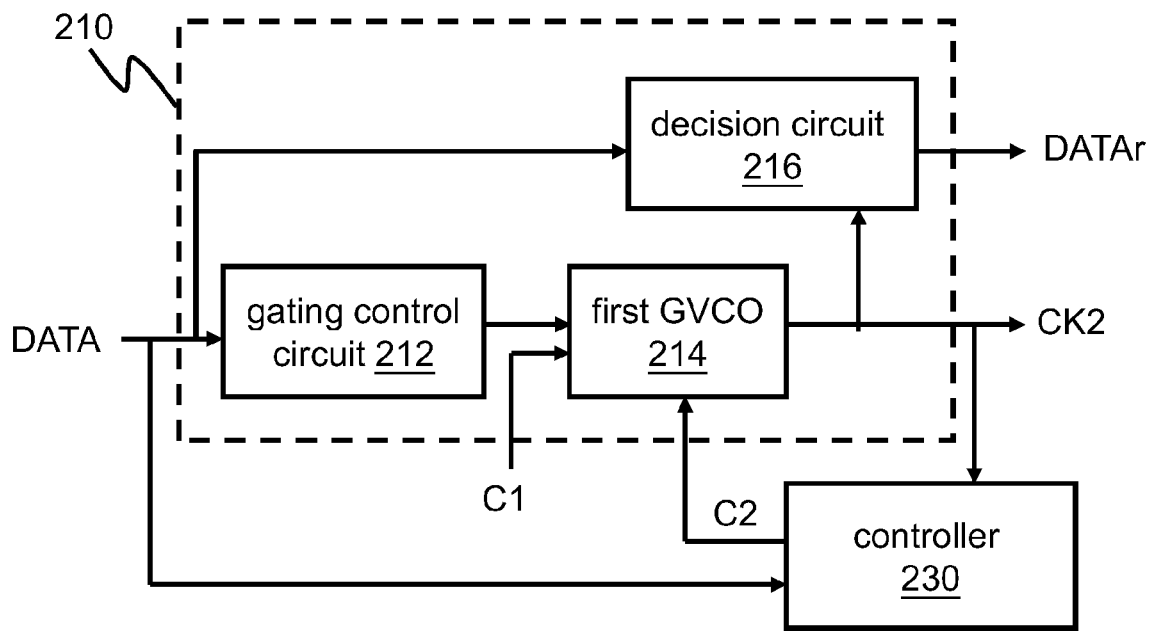
FIG. 5 shows the system structure of an embodiment of the CDR circuit in FIG. 4.

With reference to FIG. 5, the CDR circuit 210 includes a gating control circuit 212, a first gated voltage controller oscillator (GVCO) 214, and a decision circuit 216.

The gating control circuit 212, the first GVCO 214, and the decision circuit 216 are connected in series.

When an edge of the incoming data DATA appears, the gating control circuit 212 provides the edge information for the first GVCO 214. The first GVCO 214 generates a second clock CK2 corresponding and synchronized with the incoming data DATA according to the first control signal C1 from the PLL (not shown). The second clock CK2 is provided for the decision circuit 216 and the controller 230 by the first GVCO 214. The decision circuit 216 samples the incoming data DATA based on the second clock CK2 to generate a recovered data DATAr. Herein the first GVCO 214 produces the second clock CK2 with the second frequency or with the third frequency depending on the second control signal C2 provided by the controller.

In this case, the phase-locked circuit is a PLL. The PLL 220 includes in sequence a phase-frequency detector (PFD) 221, a charge pump (CP) 222, a loop filter (LF) 223, a second GVCO 224, and a frequency divider 225, in where they are connected in series into a loop, as shown in FIG. 6.

Figure 6:
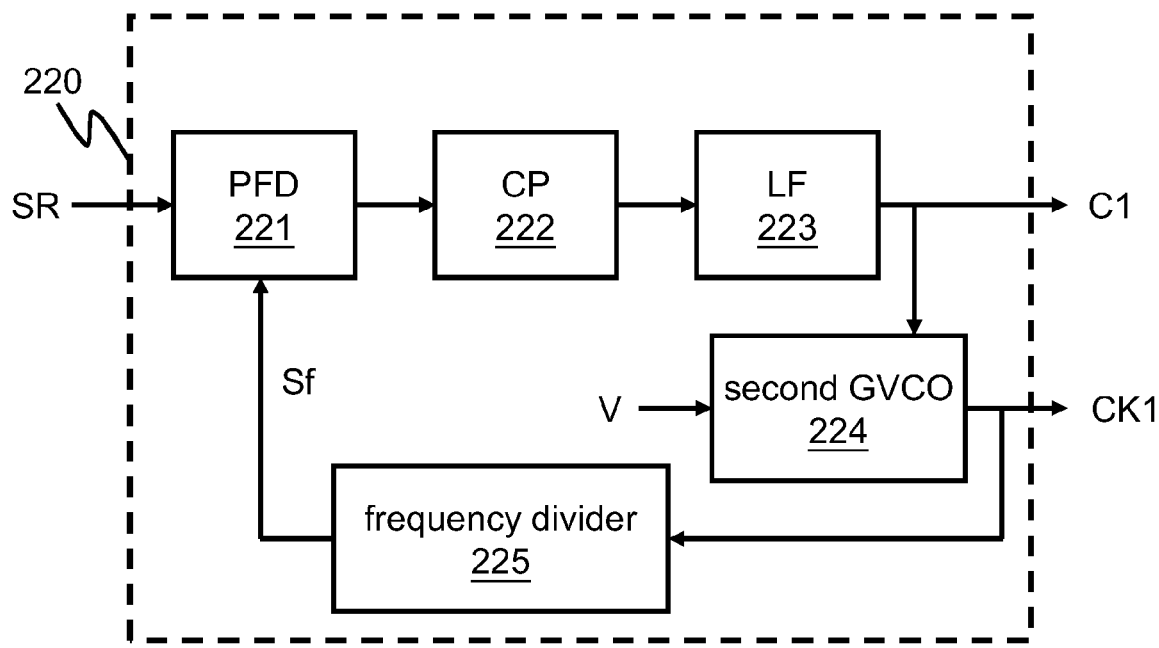
FIG. 6 shows the system structure of an embodiment of the phase-locked circuit in FIG. 4.

With reference to FIG. 6, the PFD 221 compares the phase difference between a feedback signal Sf and a reference signal SR and outputs a phase difference signal accordingly. The CP 222 and the LF 223 is implemented according to the phase difference signal from the PFD 221 in order, and a first control signal C1 is outputted. Herein the first control signal C1 is a voltage signal and its magnitude is related to the magnitude of the phase difference between the feedback signal Sf acquired by the first clock CK1 whose frequency is divided and the reference signal SR. The second GVCO 224 outputs the first clock CK1 according to the first control signal C1. The first clock CK1 is divided by the frequency divider 225 to render a feedback signal Sf, and the feedback signal Sf is supplied for the PFD 221. The phases of the feedback signal Sf and the reference signal SR are different, and therefore the PFD 221 generates a phase difference signal accordingly.

Figure 7:
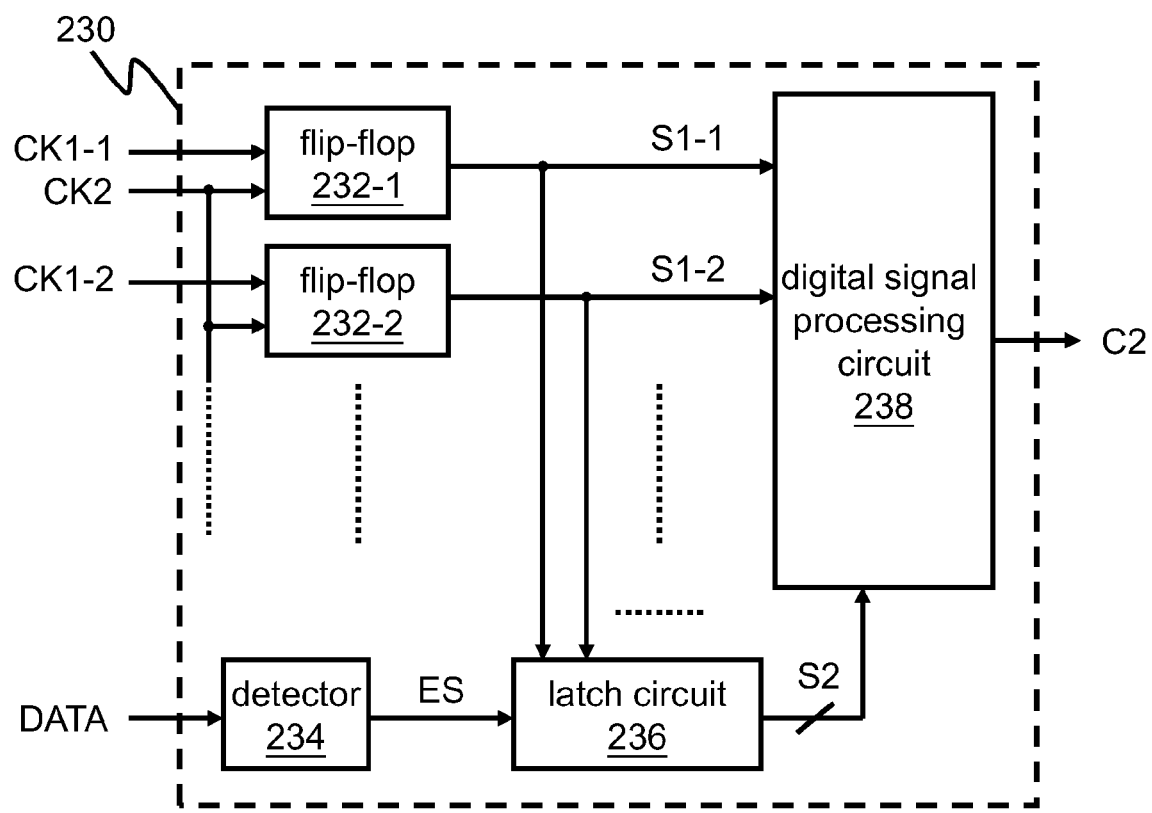
FIG. 7 shows the system structure of a first embodiment of the controller in FIG. 4.

In this embodiment, the controller as shown in FIG. 7 contains at least two flip-flops 232 (i.e. 232-1, 232-2, etc), a detector 234, a latch circuit 236, and a digital signal processing circuit 238.

Each of the flip-flops 232 is connected to the latch circuit 236 and the digital signal processing circuit 238. The detector 234, the latch circuit 236, and the digital signal processing circuit 238 are connected in series.

The first clock CK1 has several phases, i.e. CK1-1, CK1-2, etc. The first clock CK1 with each of the phases and the second clock CK2 are outputted into each of flip-flops 232. Each of the flip-flops 232 samples the first clock CK1 using the second clock CK2 to generate one of first signals S1 (i.e. S1-1 or S1-2, etc). Each of the first signals S1 is a "1" or a "0."

The detector 234 detects the bit edges of the incoming data DATA to obtain a detection result, according to which an enable signal ES is outputted. Once an edge is detected, the outputted enable signal ES is a pulse signal; otherwise, no pulse is outputted. The latch circuit 236 receives the enable signal ES outputted by the detector 234 and the first signals S1 outputted by the flip-flops 232. When the received enable signal ES appears, a second signal S2 is outputted into the digital signal processing circuit 238. Herein the latch circuit 236 outputs all the received first signals S1 to generate the second signal S2 when the enable signal ES appears. The digital signal processing circuit 238 receives the first signals S1 from the flip-flops 232 and outputs a second control signal C2 corresponding to the received first signals S1 according to the second signal S2.

Figure 8:
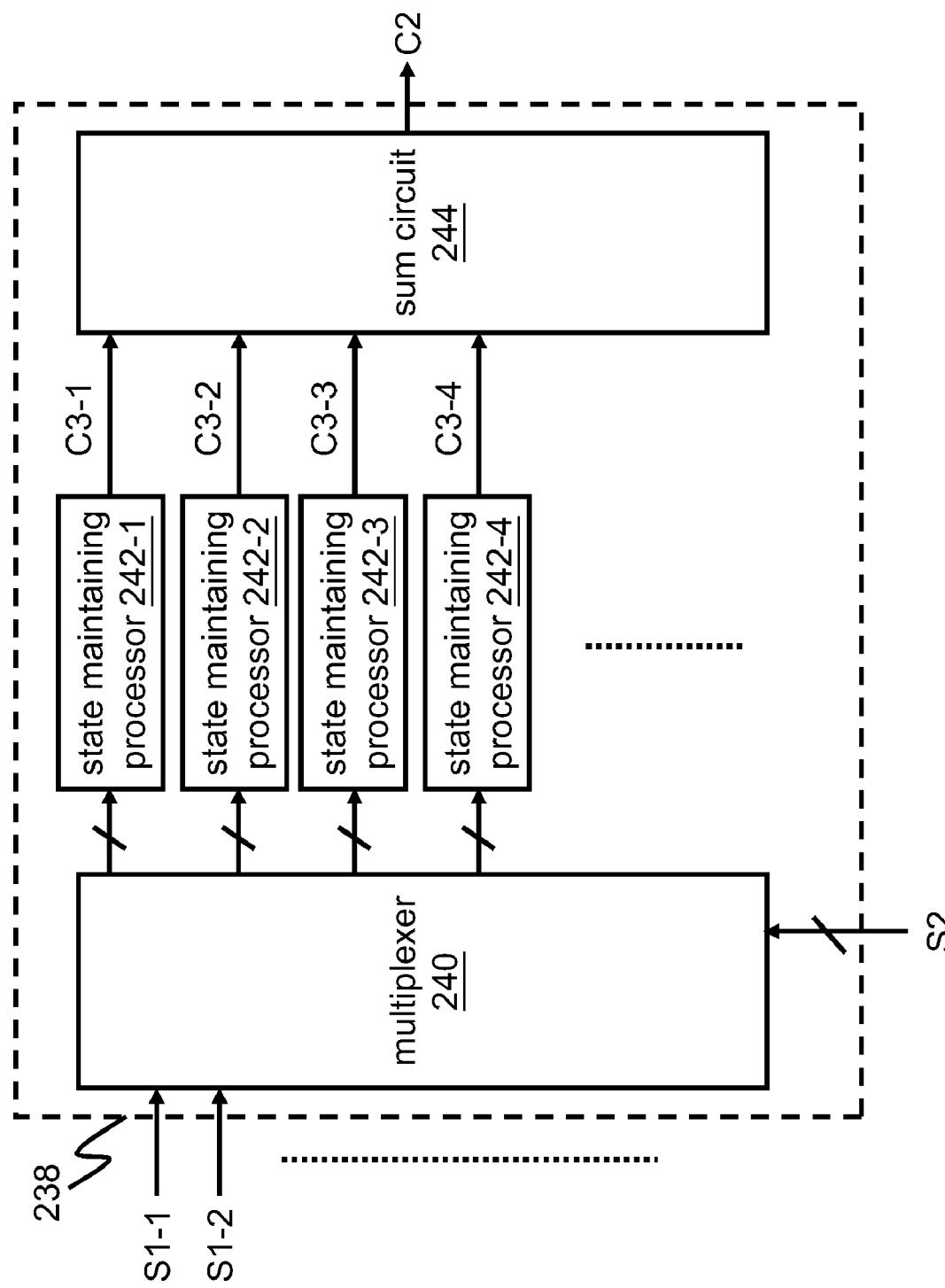
FIG. 8 shows the system structure of an embodiment of the digital signal processing circuit in FIG. 7.

The digital signal processing circuit 238 as shown in FIG. 8 contains a multiplexer 240, at least four state maintaining processors 242 (242-1, 242-2, 242-3, 242-4, etc), and a sum circuit 244.

The multiplexer 240 is connected to the sum circuit 244 via the state maintaining processors 242.

The multiplexer 240 receives the first signals S1 from all the flip-flops 232 and selectively transmits the first signal S1 to one of the state maintaining processors 242 corresponding to the second signal S2. Each of the state maintaining processors 242 generates one of third control signals C3 (C3-1, C3-2, C3-3, C3-4, etc) according to the state of received signal. The sum circuit 244 adds all the third control signals C3 up to output a second control signal C2.

The number of the state maintaining processors is twice that of the flip-flops in order to process the first signals outputted by the multiplexer.

Besides, the first clock CK1 is a plurality of single-ended signals each of which represents a phase or a plurality of differential signals each of which represents two phases, and the second clock CK2 is a single-ended signal or a differential signal.

Figure 9:
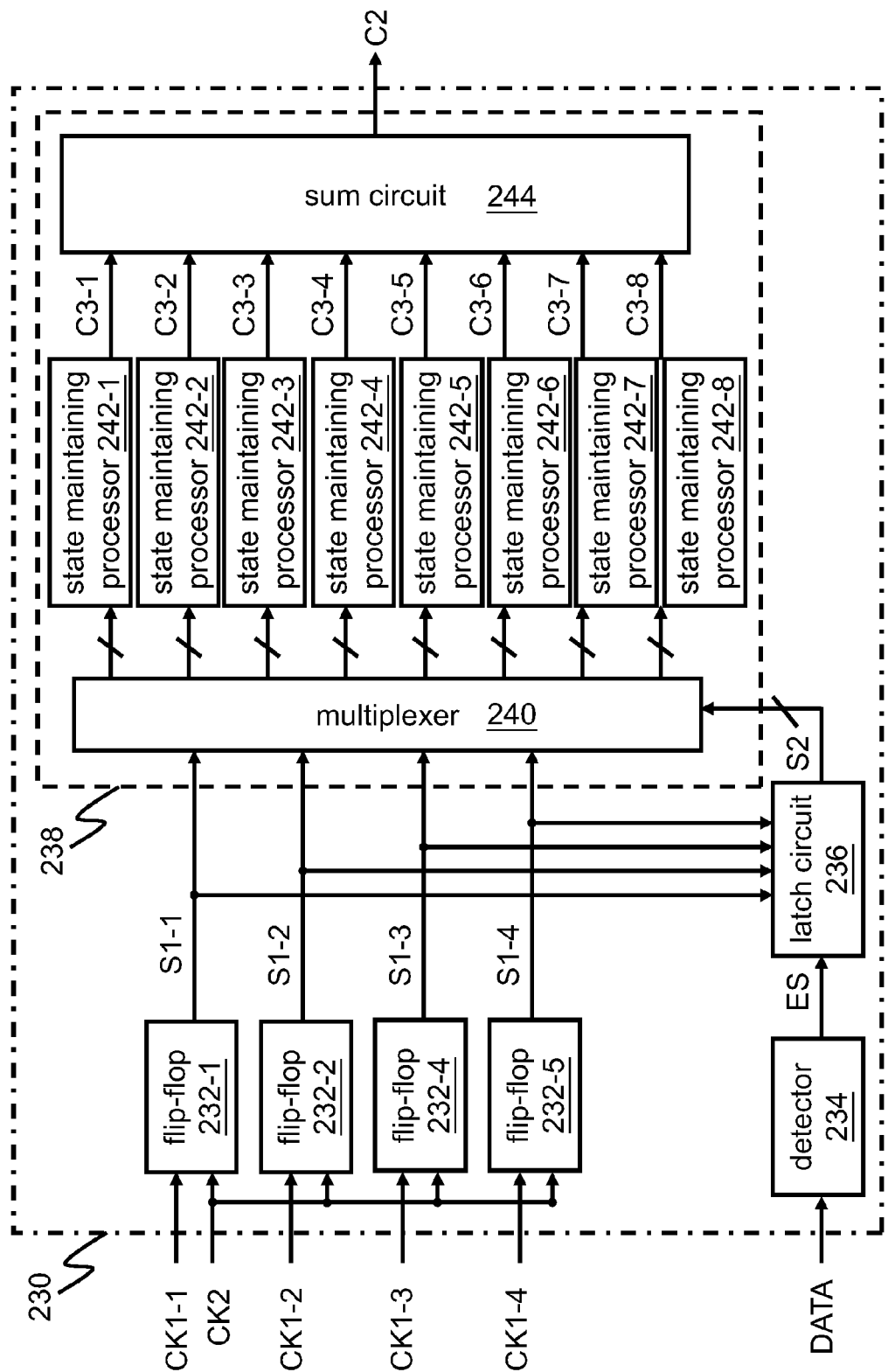
FIG. 9 shows the system structure of a second embodiment of the controller in FIG. 4.

For example, as shown in FIG. 9, we assume that the first clock CK1 has eight different phases.

If the first clock CK1 is the differential signals CK1-1, CK1-2, CK1-3 and CK1-4 each of which represents two phases, the first clock CK1-1 represents a phase which is 0 degree accompanying another phase which is 180 degrees; the first clock CK1-2 represents a phase which is 45 degrees accompanying another phase which is 225 degrees; the first clock CK1-3 represents a phase which is 90 degrees accompanying another phase which is 270 degrees; and the first clock CK1-4 represents a phase which is 135 degrees accompanying another phase which is 315 degrees.

If the first clock CK1 is the single-ended signals CK1-1, CK1-2, CK1-3, and CK1-4 each of which represents one phase, the first clock CK1-1 represents a phase which is 0 degree; the first clock CK1-2 represents a phase which is 45 degrees; the first clock CK1-3 represents a phase which is 90 degrees; and the first clock CK1-4 represents a phase which is 135 degrees.

The first clock CK1-1 and the second clock CK2 are outputted into a flip-flop 232-1, so that the flip-flop 232-1 generates a first signal S1-1 corresponding to the first clock CK1-1 according to the second clock CK2. Herein the first signal S1-1 is a digital signal of "1" or "0." Likewise, the flip-flops 232-2, 232-3, 2324 generate respectively a first signal S1-2 corresponding to the first clock CK1-2, a first signal S1-3 corresponding to the first clock CK1-3 and a first signal S1-4 corresponding to the first clock CK1-4 according to the second clock CK2.

When the detector 234 detects the transition of the incoming data DATA, it outputs an enable signal ES with a pulse signal. The latch circuit 236 receives the first signals S1-1~S1-4 from the flip-flops 232-1~232-4 and outputs a second signal S2 corresponding to the first signals S1-1~S1-4 into the multiplexer 240.

Suppose the first signals S1-1~S1-4 generated by the flip-flops 232-1232-4 are "0," "0," "1" and "1" The outputted second signal S2 is a digital signal of "0011."

In this example, the multiplexer 240 has eight 4-bit logic signal channels (e.g. 0000, 0001, 0011, 0111, 1111, 1110, 1100, and 1000). Each channel is connected to one of the state maintaining processors 242 for processing one state of the logic signals.

When the multiplexer 240 receives the second signal S2, it outputs the first signals S1-1~S1-4 to the associated state maintaining processor via the channel corresponding to the second signal S2. Each of the state maintaining processors 242 generates a third control signal C3 according to the state of the received signal. The sum circuit 244 adds all the third control signals C3 up to output a second control signal C2, thereby controlling the first GVCO to switch the frequency of the generated second clock.

As assumed above, the state maintaining processors 242-1~242-8 are used to process the signals 0000, 0001, 0011, 0111, 1111, 1110, 1100, and 1000, respectively. Therefore, when the multiplexer 240 receives the second signal S2 of "0011", the multiplexer 240 output the first signal S1-1~S1-4 into the associated state maintaining processor 242-3 via the channel of "0011". The state maintaining processor 242-3 follows the states of the first signal S1-1~S1-4 to output a third control signal C3-3 of "1" or "0," otherwise other state maintaining processors output the third control signals of "0." The sum circuit 244 adds all the third control signals C3 up to output a second control signal C2, thereby switching the output frequency of the second clock.

Figure 10:
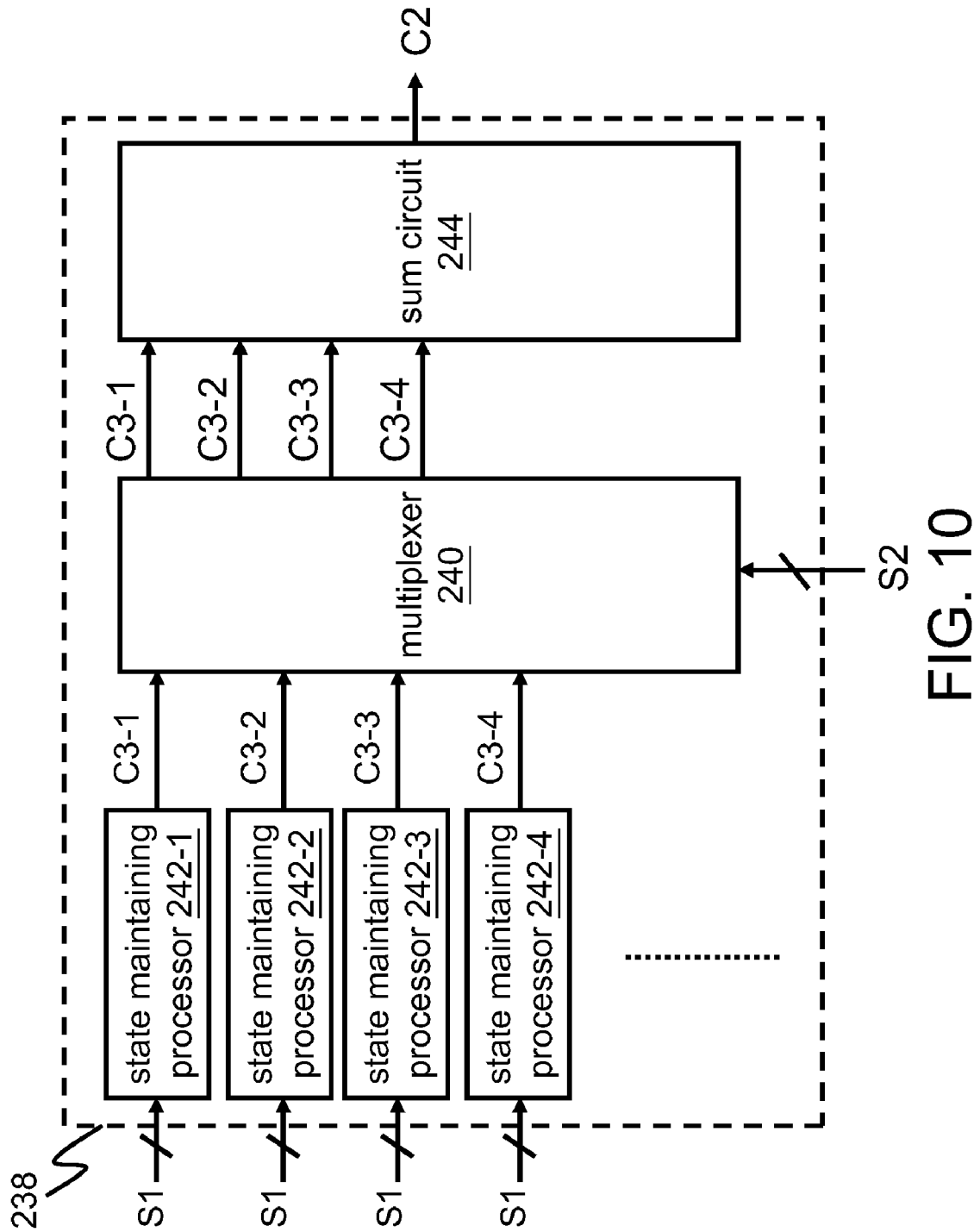
FIG. 10 shows the system structure of another embodiment of the digital signal processing circuit in FIG. 7.

In another embodiment, the digital signal processing circuit 238 as shown in FIG. 10 includes a multiplexer 240, at least four state maintaining processors 242 (i.e. 242-1, 242-2, 242-3, 242-4) and a sum circuit 244.

Each of the state maintaining processors 242 is connected to the sum circuit 244 via the multiplexer 240.

The operation of each component is substantially similar as those in FIG. 8, and we therefore do not repeat their descriptions. In this case, each of the state maintaining processors 242 receives the first signals S1 from all the flip-flops and generates a third control signal C3-1, C3-2, C3-3, or C3-4, etc based on the first signals S1. Then, the multiplexer 240 outputs the third control signals C3-1, C3-2, C3-3, or C3-4, etc based on the second signal S2 from the latch circuit. Afterward, the sum circuit 244 adds the third control signals C3-1, C3-2, C3-3, C3-4, etc from the multiplexer 240 up to generate the second control signal C2.

Herein we briefly describe how the disclosed CDR apparatus functions. Suppose the first clock CK1 generated by the phase-locked circuit has different phases I-Phase and Q-phase (differing by 90 degrees). If the first clock CK1 has two single-ended signals (CK1-1, CK1-2), then the first clock CK1-1 represents a phase 0 degree, i.e. I-Phase, and the first clock CK1-2 represents a phase 90 degrees, i.e. Q-phase. If the first clock CK1 contains two differential signals (CK1-1, CK1-2), then the first clock CK1-1 represents the phases 0 degree along with 180 degrees, i.e. I-Phase, and the first clock CK1-2 represents phases 90 degrees along with 270 degrees, i.e. Q-phase.

Figure 11:
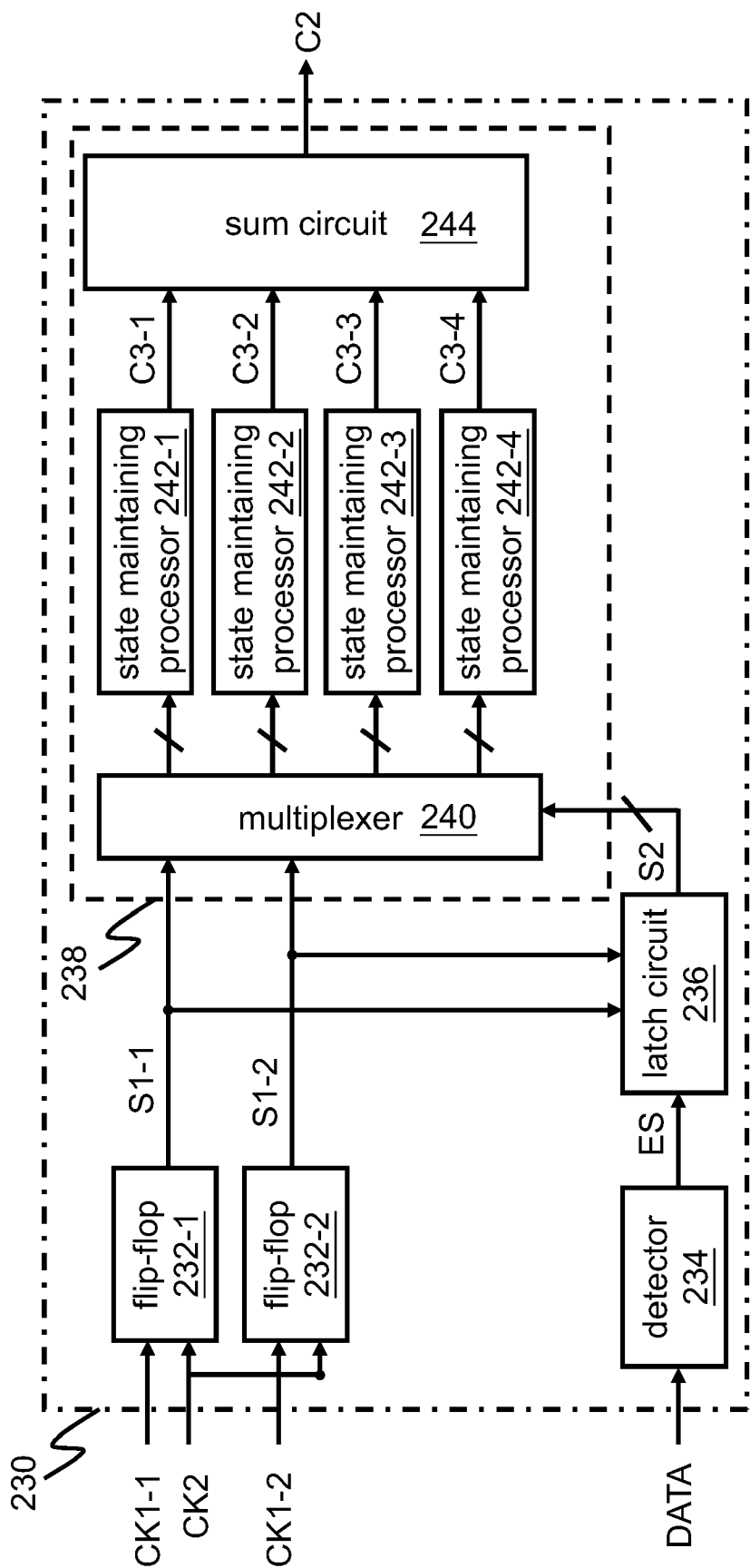
FIG. 11 shows the system structure of a third embodiment of the controller in FIG. 4.

In this case, the composition of the controller is shown in FIG. 11. Since the operations of components are substantially similar as those in FIG. 9, we do not repeat their descriptions.

Figure 12:
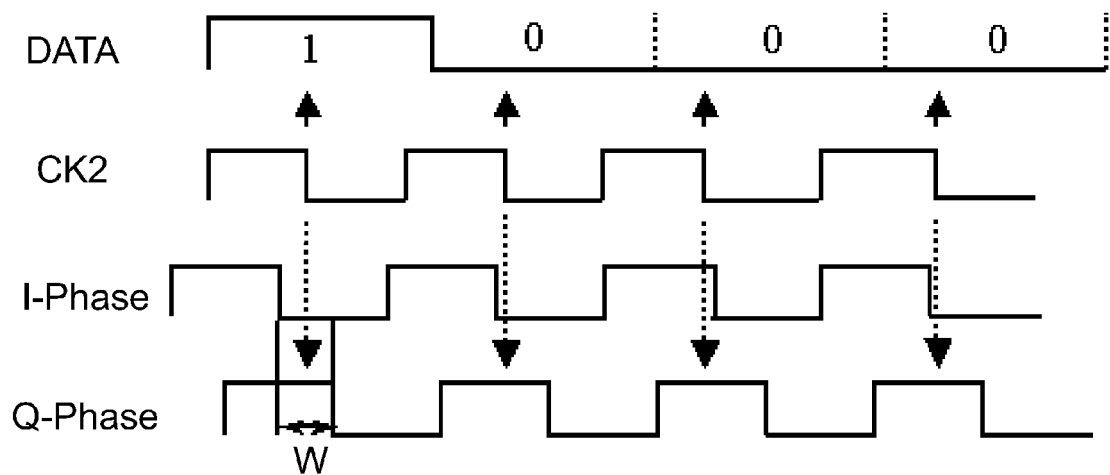
FIG. 12 shows how the CDR apparatus in an embodiment of the invention executes.

With reference to FIG. 12, when the incoming data DATA enters, the CDR circuit samples it based on the second clock CK2 to obtain recovered data (not shown). Suppose the input frequency of the incoming data DATA is fd (i.e. the first frequency), then the CDR circuit produces the second clock CK2 with a second frequency which is fnom+fbb. When fd is smaller than fnom+fbb, the sampling point is shifted to the left. Therefore, in order to cover the sampling edge of the second clock CK2, the first clock CK1 with multiple phases (I-Phase, Q-Phase) can form a sampling region W, which is smaller than ½ bit width. That is, first and second predetermined sampling edges are generated in order to prevent the sampling edge of CK2 from going beyond the edge of DATA. When the sampling point is shifted to the left and reaches the first predetermined sampling edge, the frequency of the second clock CK2 is switched to a third frequency which is fnom−fbb. The CDR circuit thus generates a second clock CK2 with the third frequency (fnom−fbb), and fd is greater than fnom−fbb. In consequence the sampling point is shifted to the right.

Figure 13:
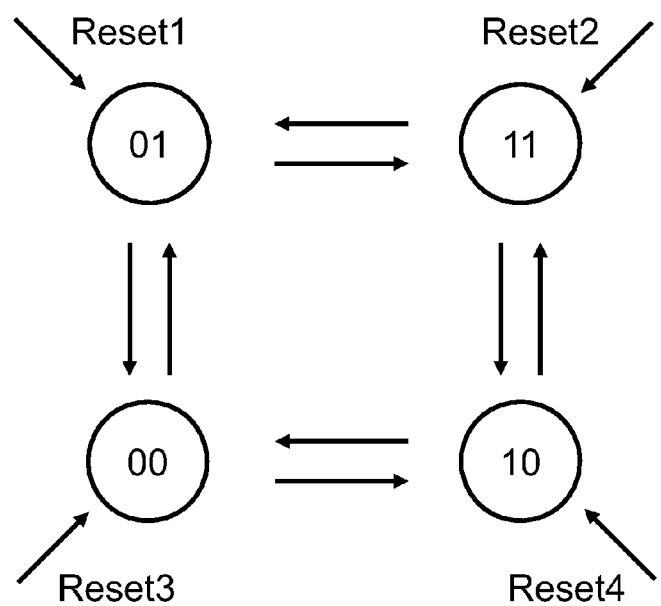
FIG. 13 shows the state diagram of the controller according to an embodiment of the invention in the state of FIG. 12.

Please refer to FIG. 13 for the functions of the controller in the state shown in FIG. 12. If the initial sampling is "01", the controller has to maintain its initial state in order to prevent the sampling state of the CDR circuit from jumping to "11" or "00."

As described above, if the second clock CK2 has the second frequency (fnom+fbb), the sampling point is shifted to the left, meaning that the sampling state is shifted to "11." When the sampling state of the CDR circuit pre-jumps to "11," the controller can produce a second clock CK2 with the third frequency (fnom−fbb) and therefore the sampling point is shifted to the right. On the other hand, if the second clock CK2 has the third frequency (fnom−fbb), the sampling point is shifted to the right, meaning that the sampling state is shifted to "00." When the sampling state pre-jumps to "00," the controller can produce a second clock CK2 with the second frequency (fnom+fbb) and therefore the sampling point is shifted to the left. Recovering correctly the incoming data is achieved by repeating the above process.

For example, when an incoming data is entered, the input frequency is fd (i.e. the first frequency) and a recovered clock with the frequency which is fnom+fbb (i.e. the second frequency) is generated by the CDR circuit. Since fd<fnom+fbb, the sampling point is shifted to the left. A reference clock with multiple phases (i.e. the first clock) is then used to from a window that encloses the sampling edges of the recovered clock. When the sampling edge approximately arrives the predetermined edges, the frequency of the recovered clock jumps to fnom−fbb (i.e. the third clock) and fd>fnom−fbb. Herein the sampling point is shifted to the right. The restriction in maximum run length of the incoming data is relieved by repeating the above process.

Figure 14:
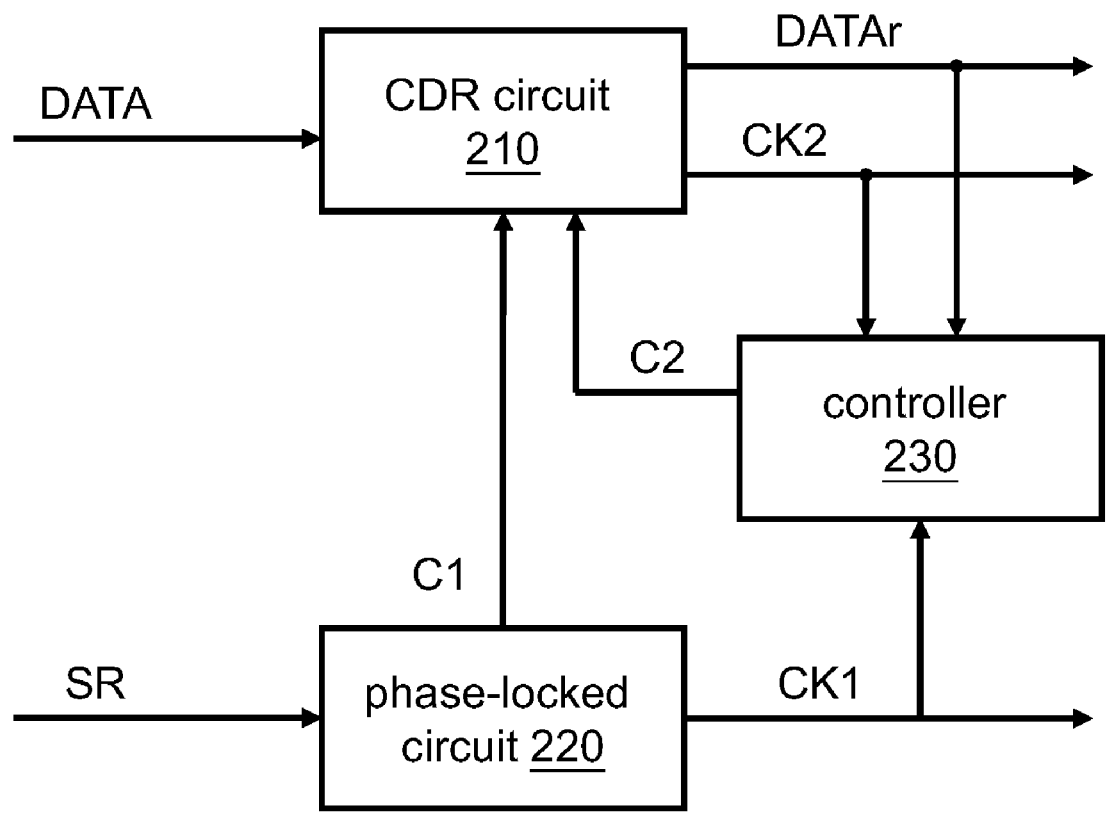
FIG. 14 shows the system structure of the CDR apparatus according to another embodiment of the invention.

In yet another embodiment, with reference to FIG. 14, the controller 230 generate a second control signal C2 according to the first clock CK1 outputted by the phase-locked circuit 220, the recovered data DATAr and the second clock CK2 which are outputted by the CDR circuit 210. The second control signal C2 is used to adjust the frequency of the second clock CK2 output by the CDR circuit 210. In other words, the recovered data DATAr has the first frequency and the second clock CK2 has the second frequency or the third frequency. Thus the controller 230 outputs the second control signal C2 into the CDR circuit 210 according to the prior recovered data DATAr, and the first and second clocks CK1, CK2, so that the CDR circuit 210 switches the outputted frequency of the second clock CK2 from the second frequency to the third frequency or from the third frequency to the second frequency, thereby sampling an incoming data to obtain the recovered data DATAr.

Since the structure and configuration of the CDR circuit, phase-locked circuit, and controller are approximately the same as before, we do not provide further descriptions here.

Based on the above, a clock and data recovery method according to an embodiment of the invention is provided, which includes the steps of: receiving an incoming data with a first frequency; generating a second clock with a second frequency and sampling the incoming data based on the second clock; forming a sampling region based on a first clock with multiple phases; switching from the second frequency to a third frequency for the second clock when a sampling point of the incoming data is about to go beyond an edge of the sampling region; switching from the third frequency back to the second frequency for the second clock when the sampling point is about to go beyond another edge of the sampling region; and repeating the above two steps until sampling the incoming data is accomplished.

Herein the first frequency is between the second and third frequencies. Moreover, the frequency difference between the second and the third frequencies is determined by the first frequency and the jitters of the incoming data. Besides, the sampling regions with different widths are formed by changing the number of phases in the first clock. This width of the sampling region is depended on the run length, the frequency and the jitters of the incoming data.

Certain variations would be apparent to those skilled in the art, which variations are considered within the spirit and scope of the claimed invention.

What is claimed is:

1. A clock and data recovery (CDR) apparatus, comprising:
   a phase-locked circuit for generating a first control signal and a first clock having a plurality of phases;
   a clock and data recovery (CDR) circuit, connected to the phase-locked circuit for receiving an incoming data, for generating a second clock with one of a plurality of frequencies, which frequency of the incoming data is within, according to the first control signal, thereby sampling the incoming data based on the second clock to output a recovered data; and
   a controller, connected to the phase-locked circuit and the CDR circuit, for generating a second control signal according one of the incoming data and the recovered data, and the first and the second clocks, wherein the CDR circuit switches the frequency of the second clock according to the second control signal.

2. The CDR apparatus of claim 1, wherein one of the incoming data and the recovered data has a first frequency, the frequency of the second clock is one of a second frequency and a third frequency, and the first frequency is between the second and the third frequencies.

3. The CDR apparatus of claim 1, wherein the controller includes:
   at least two flip-flops, each of which receives the second clock and the first clock with one of the phases and samples the first clock using the second clock to obtain a first signal;
   a detector for receiving one of the incoming data and the recovered data and detecting bit edge of it to obtain a detection result;

a latch circuit connected to the detector and each of the flip-flops for receiving the detection result and the first signal accordingly to output a second signal corresponding to the first signal; and a digital signal processing circuit connected to each of the flip-flops and the latch circuit for generating the second control signal according to the second and the first signals.

4. The CDR apparatus of claim 3, wherein the digital signal processing circuit includes:

a multiplexer for receiving the first signals outputted by the flip-flops and the second signal and outputting the received first signal according to the second signal;

at least four state maintaining processors, each of which is connected to the multiplexer and each of which generates a third control signal according to the reception state of the first signal; and a sum circuit connected to each of the state maintaining processors for adding all the third control signals from the state maintaining processors up to generate the second control signal.

5. The CDR apparatus of claim 4, wherein the number of the state maintaining processors is corresponding to that of the flip-flops.

6. The CDR apparatus of claim 5, wherein the number of the state maintaining processors is twice that of the flip-flops.

7. The CDR apparatus of claim 3, wherein the digital signal processing circuit includes:

at least four state maintaining processors, each of which receives the first signals from all the flip-flops and generates a third control signal according to the received first signals;

a multiplexer connected to each of the state maintaining processors for receiving the third control signals from all the state maintaining processors and the second signal and outputting the third control signal in response to the second signal; and a sum circuit connected to the multiplexer for adding the third control signals from the multiplexer up to generate the second control signal.

8. The CDR apparatus of claim 7, wherein the number of the state maintaining processors is corresponding to that of the flip-flops.

9. The CDR apparatus of claim 8, wherein the number of the state maintaining processors is twice that of the flip-flops.

10. The CDR apparatus of claim 1, wherein the CDR circuit includes:

a gating control circuit for receiving the incoming data and selectively outputs the incoming data according to its state;

a first gated voltage controller oscillator (GVCO) connected to the gating control circuit for generating the second clock corresponding and synchronized with the incoming data according to the first control signal; and a decision circuit connected to the first GVCO for sampling the incoming data based on the second clock to obtain the recovered data.

11. The CDR apparatus of claim 10, wherein the gating control circuit provides an edge information to the first GVCO when the edge of the incoming data appears.

12. The CDR apparatus of claim 1, wherein the phase-locked circuit is a phase-locked loop (PLL).

13. The CDR apparatus of claim 12, wherein the PLL includes:

a phase-frequency detector (PFD) for receiving a reference signal and a feedback signal and generating a phase difference signal according to the reference signal and the feedback signal, in where the frequencies of the reference signal and the incoming data have a positive integer multiple relation;

a charge pump (CP) connected to the PFD;

a loop filter (LF) connected to the OP for outputting a first control signal corresponding to the phase difference signal; and a second gated voltage controller oscillator (GVCO) connected to the LF for generating the first clock and the feedback signal based on the first control signal.

14. The CDR apparatus of claim 1, wherein the first control signal is a voltage signal.

15. A clock and data recovery (CDR) method, comprising the steps of:

(A) receiving an incoming data with a first frequency;

(B) generating a second clock with a second frequency and sampling the incoming data based on the second clock;

(C) forming a sampling region using a first clock with multiple phases;

(D) changing a frequency of the second clock from the second frequency to a third frequency when a sampling point of the incoming data substantially arrives an edge of the sampling region;

(E) changing the frequency of the second clock from the third frequency to the second frequency when the sampling point substantially arrives another edge of the sampling region; and (F) repeating the steps (D) and (E) until finishing the sampling of the incoming data.

16. The CDR method of claim 15, wherein the first frequency is between the second and third frequencies.

17. The CDR method of claim 15, further comprising the step of setting the number of phases in the first clock according to the incoming data before the step of receiving an incoming data with a first frequency.

18. The CDR method of claim 15, further comprising the step of setting the second and third frequencies according to the incoming data before the step of receiving an incoming data with a first frequency.

19. A clock and data recovery (CDR) apparatus, comprising:

a phase-locked circuit for generating a first control signal and a first clock having a plurality of phases;

a clock and data recovery (CDR) circuit connected to the phase-locked circuit for receiving an incoming data and generating a second clock according to the first control signal, thereby sampling the incoming data based on the second clock to output a recovered data; and a controller including:

at least two flip-flops, each of which receives the second clock and the first clock with one of the phases and samples the first clock using the second clock to obtain a first signal;

a detector for receiving one of the incoming data and the recovered data and detecting bit edge of it to obtain a detection result;

a latch circuit connected to the detector and each of the flip-flops for receiving the detection result and the first signal accordingly to output a second signal corresponding to the first signal; and a digital signal processing circuit connected to each of the flip-flops and the latch circuit for generating a second control signal according to the second and the first signals.

* * * * *